United States Patent
La Rosa et al.

(10) Patent No.: US 7,375,371 B2
(45) Date of Patent: May 20, 2008

(54) STRUCTURE AND METHOD FOR THERMALLY STRESSING OR TESTING A SEMICONDUCTOR DEVICE

(75) Inventors: Giuseppe La Rosa, Fishkill, NY (US); Kevin W. Kolvenbach, Walden, NY (US); John Greg Massey, Jericho, VT (US); Ping-Chuan Wang, Hopewell Junction, NY (US); Kai Xiu, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 318 days.

(21) Appl. No.: 11/307,324

(22) Filed: Feb. 1, 2006

(65) Prior Publication Data

US 2007/0235769 A1    Oct. 11, 2007

(51) Int. Cl.
  *H01L 23/58*   (2006.01)
  *H01L 29/10*   (2006.01)
  *G01R 31/02*   (2006.01)
(52) U.S. Cl. ......................... 257/48; 324/763
(58) Field of Classification Search .................. 257/48; 324/763
  See application file for complete search history.

(56) References Cited

U.S. PATENT DOCUMENTS 5,751,015 A  *  5/1998  Corbett et al.  ................ 257/48
6,456,104 B1    9/2002  Guarin et al.

\* cited by examiner

*Primary Examiner*—Evan Pert
(74) *Attorney, Agent, or Firm*—Daryl K. Neff; Lisa U. Jaklitsch

(57) ABSTRACT

A structure is provided which includes at least one semiconductor device and a diffusion heater in a continuous active semiconductor area of a substrate. One or more semiconductor devices are provided in a first region of the active semiconductor area and a diffusion heater is disposed adjacent thereto which consists essentially of a semiconductor material included in the active semiconductor area. Conductive isolation between the first region and the diffusion heater is achieved through use of a separating gate. The separating gate overlies an intermediate region of the active semiconductor area between the first region and the diffusion heater and the separating gate is biasable to conductively isolate the first region from the diffusion heater.

18 Claims, 7 Drawing Sheets

STRUCTURE AND METHOD FOR THERMALLY STRESSING OR TESTING A SEMICONDUCTOR DEVICE

BACKGROUND OF THE INVENTION

The present invention relates to testing of semiconductor devices, and more particularly, to a method of thermally stressing a semiconductor device and/or testing such semiconductor device at an elevated temperature.

P-type conductivity field effect transistors ("PFETs") tend to suffer from negative bias temperature instability ("NBTI"), an effect which increases over the lifetime of the transistor with the amount of use of the transistor. The effect is usually more pronounced when the transistor operates is used at an elevated temperature for a large amount of time. NBTI results in a decrease in the threshold voltage and drive current of a PFET with use over time, making the PFET more difficult to turn on. Conversely, a "positive" bias temperature instability ("PBTI") effect occurs in n-type FETs ("NFETs"), which are operated at an elevated temperature for a large amount of time. PBTI results in a long-term rise in the threshold voltage of the NFET, making the NFET more difficult to turn on.

NBTI is of particular concern for PFETs which are designed to operate at relatively low voltages, e.g., voltages of 1.2 V or less. Shifts in the threshold voltage and drive current of such PFETs have a significant impact upon performance. NBTI and PBTI are particularly pronounced in PFETs and NFETs, respectively, which have insulated gates, thin gate dielectrics and/or short channel lengths.

One goal of engineering is to "build" sufficient reliability into a transistor by performing accelerated lifetime stressing to reproduce how the transistor undergoes wearout over time. The design of the transistor can then be adjusted until the transistor is assured to degrade satisfactorily in the lifetime of the product. Heretofore, accelerated stressing techniques have been less than desirable for determining the long-term effects of NBTI. One requirement of accelerated lifetime stressing is to reproduce the results of wearout on a transistor in a relatively short period of time, while producing little or no disturbance to the device when tested.

In some stress/testing techniques, it is desirable to perform this characterization at the "wafer-level," i.e., under conditions in which a chip which contains the transistor remains connected to one or more other chips of a wafer. Some such testing may also be performed "in-line," i.e., at a time between performing other steps in a process of fabricating chips of a wafer. Such testing may involve application of stress test conditions to a device and monitoring for the effects of such test conditions upon the operation of the device. In order to justify such testing as a part of an in-line monitoring scheme, such stress test conditions and monitoring may need to be completed in a short period of time, for example, in about 10 seconds or less.

Another requirement of such testing is the ability to quickly elevate the temperature of a device of a wafer under test to a desired level for in-line testing. The ability to quickly achieve a desired elevated temperature for such in-line testing is a critical need for the continued development of complementary metal oxide semiconductor ("CMOS") technology and monitoring of the fabrication process thereof. Monitoring techniques according to the prior art can only be applied at in-line test temperatures between 25 and 85 degrees Celsius. Such techniques are unable to monitor wearout mechanisms which are active at temperatures higher than 85 degrees Celsius. A particular constraint of such prior art techniques is long tester time, typically between 20 and 30 minutes, that is needed to increase the temperature of a transistor under test from that of an in-line testing temperature to a stress temperature of interest, which can be 140 degrees Celsius or higher. This long delay slows down the testing and monitoring process.

Reliability degradation mechanisms such as NBTI for PFET devices and PBTI for NFET devices, need sufficient high temperatures to become active; i.e., temperatures of at least about 100 degrees Celsius. To monitor the sensitivity of a FET to the manufacturing process, the channel of an FET must be heated quickly to a stress temperature needed to reproduce an equivalent amount of degradation that would be produced during the long lifetime of the FET. The inventors know of no effective inline monitor for NBTI that adequately addresses such need.

Resistive heaters which include a polysilicon element ("poly-heaters") have been used to heat an FET when a current and voltages are applied to operate the FET. However, heretofore, such poly-heaters have not been able to raise the FET to a stress temperature fast enough to function as an inline monitor for NBTI or PBTI. One reason for this is the high thermal conductivity of silicon, which allows most of the heat generated by such poly-heaters to escape into an n-well of the device or deeper into a bulk region of the substrate. Poly-heaters are capable of imparting only a limited amount of heat to an FET.

Consequently an improved structure and method for heating the channel region of an FET are desired.

SUMMARY OF THE INVENTION

According to one aspect of the invention, a structure is provided which includes at least one semiconductor device and a diffusion heater in a continuous active semiconductor area of a substrate. One or more semiconductor devices are provided in a first region of the active semiconductor area, and a diffusion heater is disposed adjacent thereto which consists essentially of a semiconductor material included in the active semiconductor area. Conductive isolation between the first region and the diffusion heater is achieved through use of a separating gate. The separating gate overlies an intermediate region of the active semiconductor area between the first region and the diffusion heater and the separating gate is biasable to conductively isolate the first region from the diffusion heater.

DETAILED DESCRIPTION

Figure 1A:
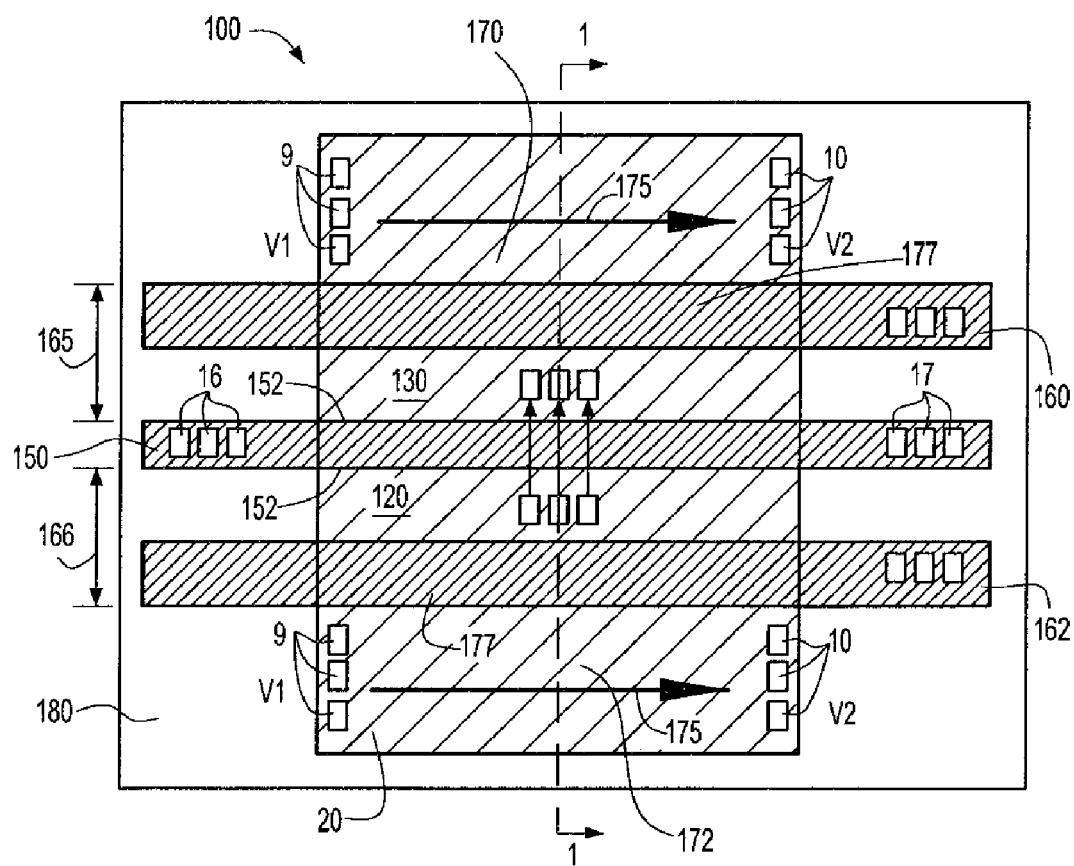
FIG. 1A is a top-down plan view of a semiconductor structure in accordance with an embodiment of the invention.

FIG. 1A illustrates a top-down plan view of an FET structure 100 and associated heating mechanisms used to test the field effect transistor (FET) for bias temperature instability when the FET is biased with the active gate in inversion. Such effect occurs especially in FETs having insulated gates ("IGFETs"). However, the principles of the invention described herein can be applied to the testing of different types of transistors, as well as FETs, and for testing for different parameters of transistor operation. For example, the structure shown in FIG. 1A can be used for measuring an amount of mobile charge conducted by the FET by measuring the same at one or more elevated temperatures achieved through heating the FET.

As illustrated in the top-down plan view in FIG. 1A, an FET 100 is disposed in a continuous single-crystal active semiconductor area 20 of a substrate, as separated from other parts of a substrate preferably by a shallow trench isolation region ("STI") region 180. The substrate can either be a bulk substrate or a semiconductor-on-insulator substrate such as a silicon-on-insulator (SOI) substrate in which a relatively thin single-crystal region of a semiconductor is formed over an insulating layer. When field effect transistors (FETs) are formed in such SOI substrates, faster switching operation is often achieved than otherwise, due to elimination of junction capacitance between the channel region of the transistor and the bulk substrate. When the FET is provided in a silicon-on-insulator (SOI) substrate, the FET can be a p-type FET ("PFET") or an n-type FET ("NFET"), each having a structure as shown in FIG. 1A.

For ease of description, an example will first be described of an n-type FET formed in a bulk semiconductor substrate. Referring to FIG. 1A, the n-type FET 100 includes a channel region (hidden from view) and an active gate 150 overlying and spaced from the channel region by a gate dielectric. The n-type FET 100 also includes a source region 120 and a drain region 130 disposed on opposite sides of the active gate 150, the source, channel and drain regions all being disposed within the same active semiconductor area 20. The active gate 150 functions to control conduction between the source region and drain region of the transistor. A first set of conductive contacts 16 or electrodes or "terminals" are provided for applying a voltage or current to the active gate 150 at one end thereof, the contacts 16 preferably being provided at a location of the active gate which overlies the STI region 180. A second set of conductive contacts 17 or electrodes or "terminals" are provided for applying a voltage or current to another end of the active gate 150, the second set of contacts 17 preferably being provided at a location of the active gate that is spaced apart from the first set of contacts. Such location preferably overlies a portion of the STI region 180 spaced apart from the location of the first set of contacts 16 by at least a dimension of the active semiconductor area 20.

A first accumulating gate 160 or first "separating gate" is spaced from the active gate 150 by one of the source region 120 or drain region 130 of the FET 100; i.e., the drain region 130 as shown in FIG. 1A. A second accumulating gate 162 or second "separating gate" is spaced from the active gate 150 by the other one of the source region 120 or drain region 130; i.e., the source region 120 as shown in FIG. 1A. The active gate 150, the first accumulating gate 160, and the second accumulating gate 162 all overlie the same active semiconductor area 20 that is surrounded by the shallow trench isolation region 180. The first and second accumulating gates 160 and 162 are disposed parallel to each other and to the active gate 150. The two accumulating gates 160 and 162 need to be of sufficient length to provide conductive isolation relative to the source region 120 and drain region 130 of the FET during testing at an elevated temperature.

A first diffusion resistor 170, also referred to herein as a diffusion heater, is disposed in the active semiconductor area 20 laterally outside and adjacent to the accumulating gate 160 such that the accumulating gate 160 conductively isolates the drain region 130 from the diffusion resistor 170. A second diffusion resistor 172, also referred to herein as a diffusion heater, is disposed in the active semiconductor area laterally outside and adjacent to the accumulating gate 162, such that the accumulating gate 162 conductively isolates the source region 120 from the diffusion resistor 172. The diffusion resistors 170 and 172 are operable to variably heat at least a portion of the FET structure 100 by conducting current in a direction indicated by the arrows 175. A first set of conductive contacts 9, electrodes or "terminals" are provided at first ends of the diffusion resistors 170, 172 and a second set of conductive contacts 10, electrodes or "terminals" are provided at second ends of the diffusion resistors. The amount of heat produced by each diffusion resistor is controlled by the magnitude of the current which flows through each diffusion resistor. The magnitudes of the currents are controlled by the differences between voltages V1 and V2 which are applied to the first and second sets of contacts 9, 10, respectively, given the resistance of the diffusion resistors. Thus, variable amounts of heat are produced by each diffusion resistor as controlled by the voltages V1 and V2 applied to the first and second sets of contacts, respectively. In turn, each diffusion resistor imparts an amount of heat to the channel region of the FET 100 in proportion to the amount of heat it generates and the distance 165 or 166 between peripheral edges 177 of the diffusion resistors and each respective peripheral (outer) edge 152 of the active gate 150.

Figure 1B:
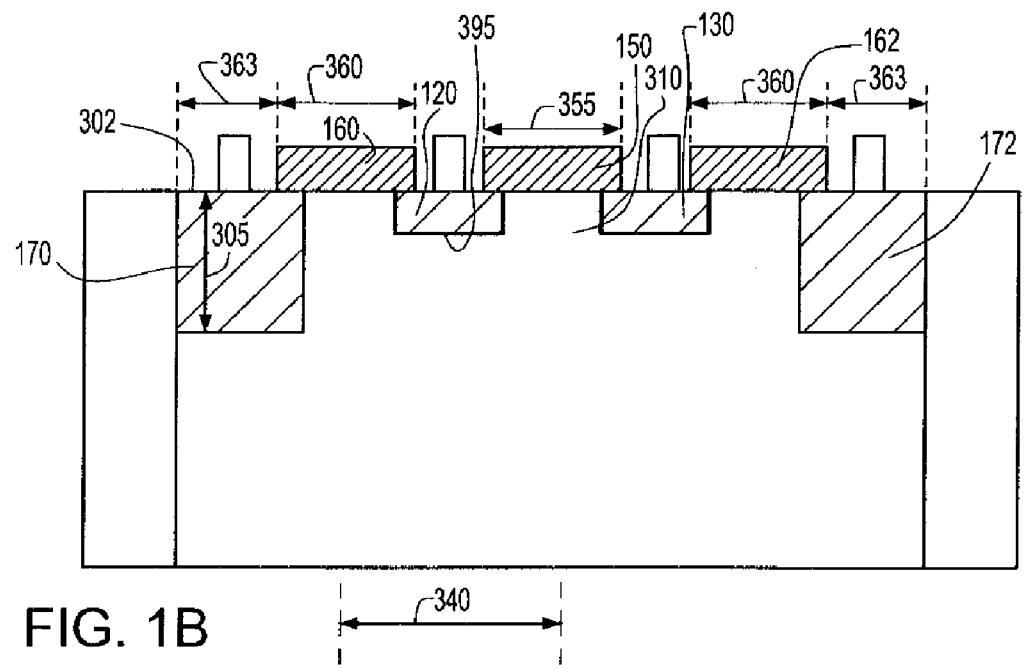
FIG. 1B is a sectional view along line 1-1 of the semiconductor structure illustrated in FIG. 1A.

FIG. 1B is a sectional view of the bulk n-type FET 100 along line 1-1 of FIG. 1A. The diffusion resistors 170 and 172 have a deep doping profile, having a junction depth 305 which extends deep below a major (upper) surface 302 of the semiconductor active area. The deep junction depth 305 benefits the propagation of heat laterally towards the channel region 310 of the FET. Preferably, the junction depth 305 of the diffusion resistors 170 and 172 is much deeper than the depth 395 of the junctions between the n-wells in which the source region 120 and drain region 130 of the FET are provided and the bulk substrate. Stated another way, the depth 305 is deeper than the junction 395 between those n-wells and the bulk substrate.

The accumulating gates 160 and 162 need to have sufficient width to prevent the flow of current between the diffusion resistors 170 and 172 and the source region 120 and the drain region 130 of the FET, respectively. Typically, the accumulating gates have greater width 360 than the width 355 of the active gate 150. The accumulating gates 160 and 162 have width 360 which can be adjusted by design according to the temperature to be produced in the channel region 310 of an FET, given a finite amount of current that will flow through the diffusion resistors 170 and 172. The width 363 of diffusion resistors 170, 172 can be adjusted by design as well, according to the amount of heat to be imparted into the channel region 310 below the active gate 150. The length 340 of the path between the center of each accumulating gate 160 and the center of the active gate 150 is a parameter affecting the temperature to which the FET can be raised by the diffusion resistors 170, 172, as described below.

Figure 2:
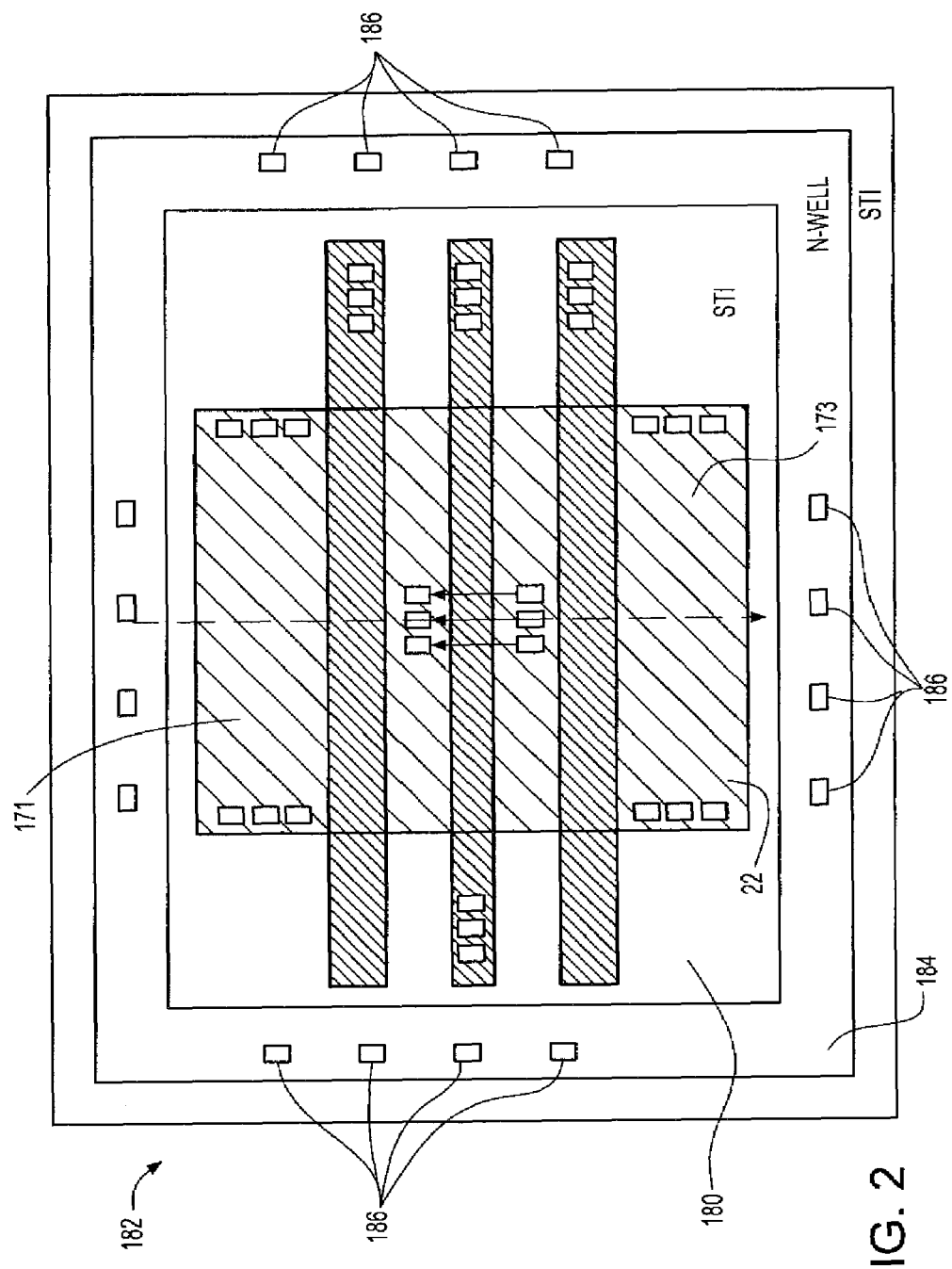
FIG. 2 is a top-down plan view illustrating a semiconductor structure according to a variation of the embodiment illustrated in FIGS. 1A-B.

With reference to FIG. 2, a variation of the above embodiment will now be described in which a p-type FET is provided in a bulk substrate. The PFET structure 182 differs from such bulk NFET structure 100 (FIGS. 1A-B) described above in that it includes an additional n-doped well or "n-well" that is disposed throughout the active semiconductor area 22 of the PFET and in an n-well contact region 184 disposed outside of the shallow trench isolation 180. The source region 122 and the drain region 132 of the PFET 182 are p-type regions disposed within the n-well, as well as the diffusion resistors 171 and 173. A set of conductive contacts 186 are preferably provided to the n-well contact region 184 at various locations, e.g., at locations next to edges of the STI region 180 surrounding the PFET structure 182. With such structure, a substrate ground voltage or substrate bias voltage can be applied to the n-well of the PFET.

In another variation of the embodiments described above, a FET is provided in a SOI substrate. In such case, the layout of the FET appears as shown in the top-down plan view of FIG. 1A and the layout appears the same, whether the FET has n-type or p-type conductivity. When viewed in cross-section, such SOI FET appears similar to that shown in FIG. 1B, except that the substrate additionally includes a buried oxide ("BOX") layer disposed below the active semiconductor area, the BOX layer extending horizontally in directions parallel to the major surface 302 of the substrate. In such SOI FET, the BOX layer has an upper boundary that preferably coincides with the maximum depth of the source and drain regions 120, 130, that maximum depth being the depth 395 of the implants used to form the source and drain regions. In such embodiment, the diffusion heaters 170, 172 do not extend to as great a depth as in the above-described bulk substrate embodiments. Rather, the diffusion heaters need only extend to a depth at which they contact the BOX layer, such depth being the same depth 395 at which the source and drain regions would contact the BOX layer.

Figure 3:
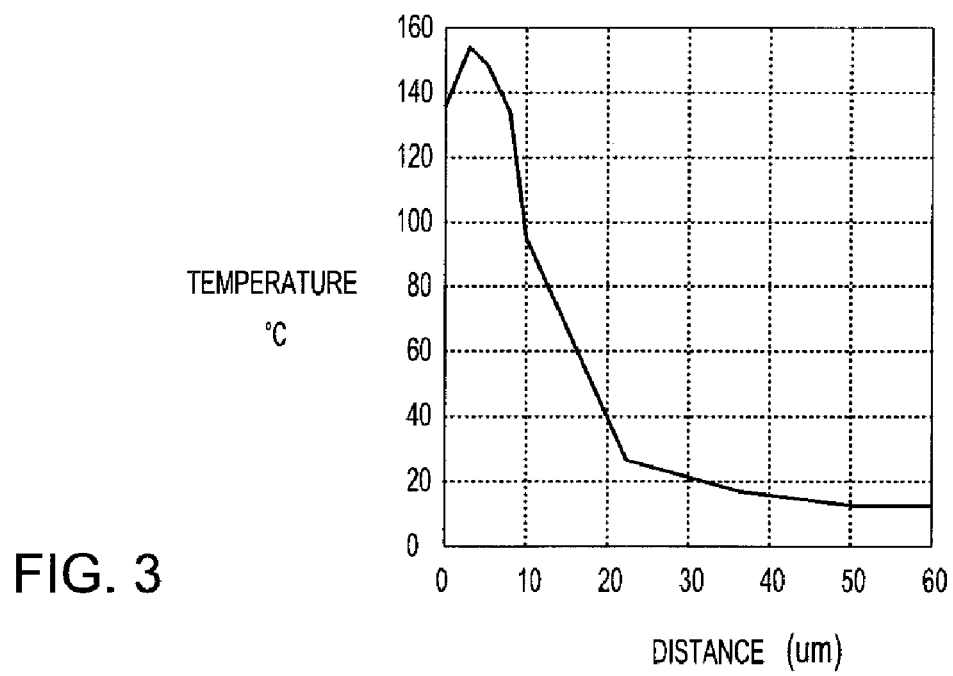
FIG. 3 is a graph illustrating a variation in temperature along line 1-1 with distance from a center of a channel region of the FET structure depicted in FIG. 1A.

FIG. 3 is a graph illustrating variation in the temperature of the FET structure 100 (FIGS. 1A-B and 2) according to distance from the center of the channel region of the FET, as determined by a mathematical simulation of using the diffusion resistors to heat the FET structure. In FIG. 3, the leftmost location on the horizontal axis (at x=0) represents the center of the channel region. Temperatures are marked on the vertical (y-axis) in units of degrees Celsius ("C") and distances along the horizontal axis (x-axis) are marked in units of microns (μm). The results of the mathematical simulation indicate that when the distance 340 (FIG. 1B) between the center of one accumulating gate 160 and the center of the active gate 150 is less than 3 to 4 microns, the temperature of the channel region will be held at about 140 degrees C. under conditions in which voltages V1 and V2 are applied to the resistive diffusion heaters 170, 172. The temperature of 140 degrees C. is above the minimum temperature of 100 degrees C. that is believed to be needed for adequately subjecting the FET structure to temperature stress.

Figure 4:
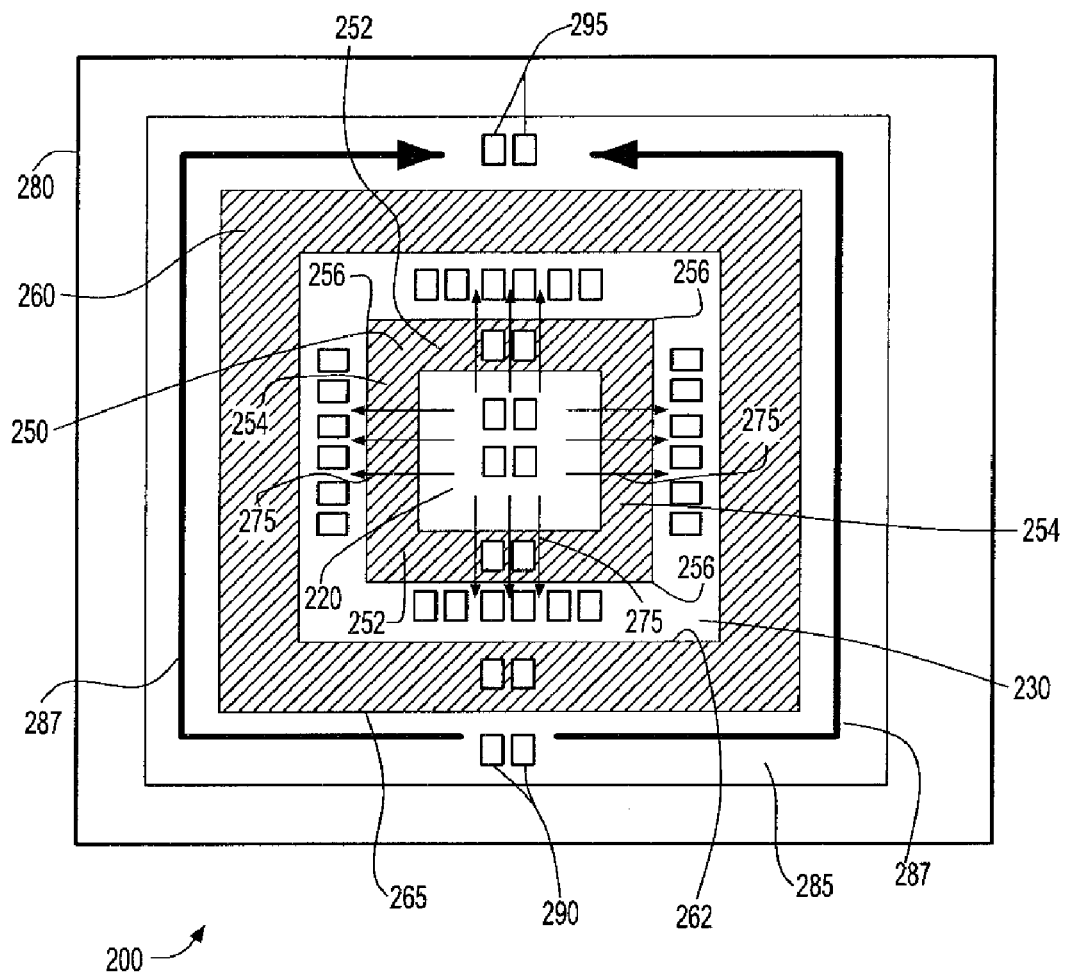
FIG. 4 is a top-down plan view illustrating a semiconductor structure in accordance with a particular embodiment of the invention.

An FET structure 200 including a diffusion resistor according to another embodiment of the invention will now be described with reference to FIG. 4. As shown in top-down plan view in FIG. 4, the FET structure 200 includes an active gate 250 having an annular shape which overlies a channel region of a field effect transistor ("FET"), the channel region being hidden from view in FIG. 4. A source region 220 of the FET is disposed in a portion of the semiconductor device region enclosed by the active gate 250. The drain region 230 is disposed in another portion of the semiconductor device region that lies laterally outside of the active gate 250. As shown in FIG. 4, the active gate includes horizontal portions 252 and vertical portions 254 joined to the horizontal portions at corners 256. The channel region of the FET structure 200, source region 220 and drain region 230 are preferably disposed in a semiconductor device region which is surrounded or at least substantially surrounded by a shallow trench isolation region 280.

As further shown in FIG. 4, an accumulating gate 260 similar to that described above relative to FIGS. 1A-B and 2 is provided as an annular structure disposed laterally outward from the FET. In this case, the accumulating gate is disposed laterally outward from the drain region 230 of the FET. Stated another way, the accumulating gate 260 surrounds a portion of the active semiconductor area in which the FET including the source region 220, the channel region and the drain region 230 are disposed. The accumulating gate has a plurality of inner edges 262 and a plurality of outer edges 265 disposed laterally outward from the inner edges 262. A diffusion resistor 285 having an annular structure is disposed laterally outward of the outer edges 265, the diffusion resistor extending in directions parallel to the outer edges 265 of the accumulating gate. In one preferred embodiment, the degree of heating caused by the diffusion resistor 285 is proportional to an amount of current conducted by the diffusion resistor in the directions parallel to the outer edges 265 of the accumulating gate 260. An external source of voltage or current can be applied to the diffusion resistor 285 through a first set 290 of electrodes (e.g., positive electrodes) and a second set 295 of electrodes (e.g., negative electrodes) to produce current in the diffusion resistor moving in directions parallel to the outer edges 265 of the accumulating gates, as shown by arrows 287.

In the FET structure 200 shown in FIG. 4, heat is conducted in a lateral direction which is transverse to the directions in which the active gate 250 extends, i.e., in a lateral direction inward from the drain region 230 towards the source region 220 and in a lateral direction outward from the source region 220 towards the drain region 230, as indicated by arrows 275. Thus, the diffusion resistor 285 conducts heat towards the channel region of the transistor and to impede the flow of heat away from the channel region of the transistor.

Alternatively, in a variation of the FET structure described above with reference to FIG. 4, the active gate, the accumulating gate and the source and drain regions of the semiconductor device area have edges which are continuous and smooth. In such embodiment, rather than the active gate and the accumulating gate having sharp corners (e.g., corners 256) at intersections between the vertical portions and the horizontal portions as shown in FIG. 4, the gates extend in smooth circular, elliptical or oblong paths in which the edges of the active gate and accumulating gate are continuous and smooth. In another variation of such embodiment, the gates have horizontal and vertical portions but the corners at the intersections of those portions are radiused. In yet another variation, the FET structure is polygonal in shape, having straight sides. However, such FET can include a different number of sides, e.g., 5, 6, 7 or more sides, than in the square or rectangular embodiment shown in FIG. 4. Similar enclosed structures can be used to characterize bias temperature instabilities in other devices such as bipolar transistors. In this case, the active area enclosed within the accumulating gate contains a bipolar transistor instead of a FET.

Figure 5A:
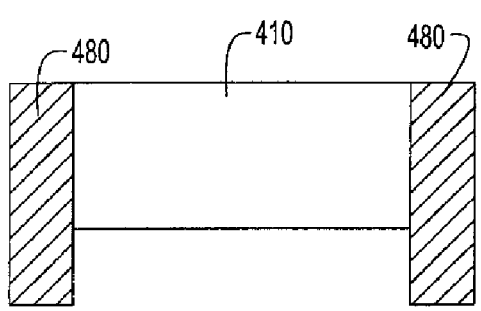
FIGS. 5A through 5E are sectional views illustrating stages in a method of fabricating a semiconductor structure according to an embodiment of the invention.
Figure 5B:
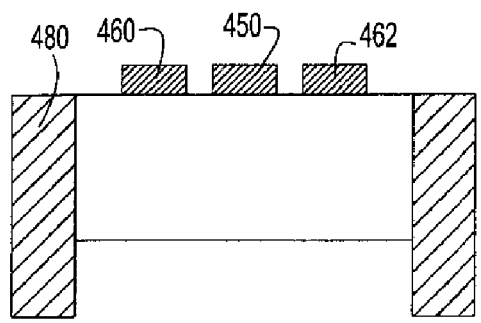

Referring to FIGS. 5A to 5E, a process will now be described of making the structure described above relative to FIGS. 1A-B, 2 or FIG. 4 will now be described. FIG. 5A is a sectional diagram depicting a semiconductor device area 410 surrounded by an STI region 480. Referring to FIG. 5B, a gate dielectric (not shown) is formed at the upper surface of the semiconductor device area. An active gate conductor 450 and gate conductors 460, 462 are patterned to overlie the active semiconductor area, as by a process of deposition and photolithographic patterning.

Figure 5C:
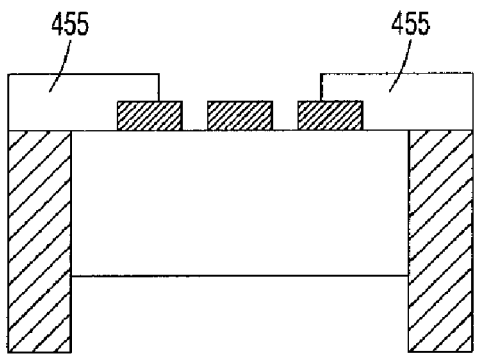
Figure 5D:
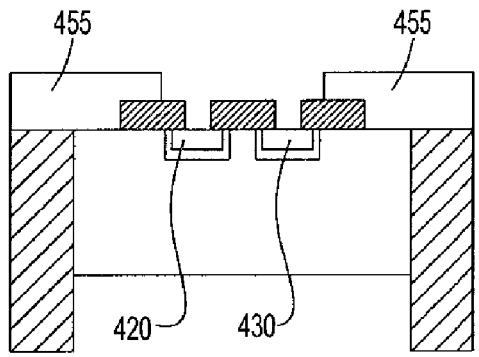
Figure 5E:
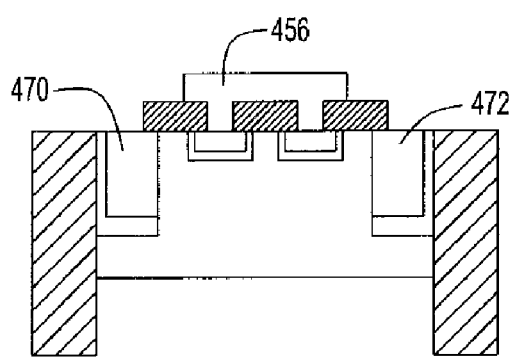

Thereafter, as illustrated in FIG. 5C, a mask 455 is deposited and patterned to cover areas where the diffusion resistors will be subsequently formed. As illustrated in FIG. 5D, ion implantation is performed into areas of the semiconductor area which will subsequently become the source region 420 and the drain region 430. Subsequently, as shown in FIG. 5E, an additional deep ion implantation is performed to form the diffusion resistors 470 and 472, which extend to a greater depth in the substrate than the source and drain regions.

Referring again to FIGS. 1-B, 2 or 4 the FET structure 100 can be used in a variety of ways to apply temperature stress to test a FET. An example of such test will now be discussed. In one preferred embodiment, the FET structure 100 is tested at the stress conditions at a time when a chip containing the FET structure 100 (FIG. 1A) remains attached to other chips in form of a wafer, or alternatively, a multiple-chip containing substrate or multi-chip module.

Preferably, before applying voltages to the gate, source and drain terminals of the FET structure, a stress temperature is established in the FET structure 100 by applying a voltage V1 to the first sets of contacts 9 and applying a second voltage V2 to the second sets of contacts 10 to cause the resistive diffusion heaters 170 and 172 to conduct. The voltages V1 and V2 applied to the contacts are selected such that the diffusion resistors are reverse-biased with respect to the bulk region of the semiconductor device area. The diffusion resistor 170 and the drain region 130 are biased such that they operate in a manner similar to two diodes connected together back to back, i.e., in which the anodes of the diodes are conductively connected to each other. Similarly, the diffusion resistor 172 and the drain region 120 are biased such that they operate in a manner similar to two other diodes connected together back to back.

Voltages are applied to the accumulating gates 160 and 162 to promote accumulation of charge carriers. This has the effect of preventing punch-through currents from being conducted between the source region 120 and drain region 130 of the transistor and the diffusion resistors 170 and 172 under the applied voltages at stress conditions.

The channel temperature is measured by monitoring the resistance of the active gate 150. This can be performed, for example, by causing a known amount of current to flow along the active gate 150 in a direction between the contacts 16 and 17 and measuring the voltage difference between the sets of contacts 16 and 17 to determine the resistance. A calibration is performed to determine the relationship between the resistance thus determined and the temperature which is achieved in the active gate.

Device characteristics are measured at the stress temperature before the voltage stress conditions are applied. For example, the device characteristics of on-current supplied to the FET, the threshold voltage of the FET and/or other such characteristics are measured at this time.

A selected voltage stress condition is then applied to the gate, source and drain terminals of the FET for a short time period, within which a corresponding amount of physical damage is expected. The following case examples 1) and 2) illustrate voltage stress conditions applied to an FET test structure as illustrated in FIGS. 1A-B and 2. Case 1) illustrates an example of stressing for NBTI when the FET structure includes a PFET. Case 2) illustrates an example of stressing for PBTI when the FET structure includes an NFET.

Case 1) illustrates conditions for stressing NBTI for a PFET device:

Voltages $Vd=Vs=0$ Volts where Vs and Vd are the voltages applied to the source and the drain, respectively.

$V(GA)=V(C1)=V(C2)<0$ volts where $V(GA)$ is the voltage across the active gate and $V(C1)$ and $V(C2)$ are the voltages applied to the active gate contacts 16 and 17. This applies to an embodiment of an SOI PFET device as described with reference to FIGS. 1A, or 4 above. When the PFET is provided in a bulk substrate as described with reference to FIG. 2, there is an n-well 184 which is biased at a voltage $V(NW)=0$ volts.

Case 2) illustrates conditions for stressing PBTI for an NFET device:

Voltages $Vd=Vs=0$ volts, where Vs and Vd are the voltages applied to the source and the drain, respectively.

In addition, the voltages $V(GA)=V(C1)=V(C2)$, all preferably being set to the same voltage greater than zero volts. When the NFET is provided in a bulk substrate, $V(SX)$ (substrate bias) is set to zero volts. When the NFET is provided as an SOI device, no substrate bias need be applied.

In each of the cases 1 and 2 above, the current which flows in the resistive diffusion heaters 170, 172 maintains the temperature of the channel region of the FET at a selected stress condition.

Thereafter, the voltage stress condition is removed and device characteristics (e.g., on-current and threshold voltage) are once again measured at the stress temperature and effects on the reliability of the transistor are assessed.

It should be noted that the embodiments of the invention herein are not limited to the uses described above by way of example. In addition to use in applying controlled temperature stress to the channel of a field effect transistor, the principles of the present invention can be applied to both n-type FETs and p-type FETs, as well other types of transistors such as bipolar transistors and other FEOL structures. Sensitivity to temperature-activated wearout mechanisms can be monitored according to embodiments of the present invention by wafer level inline monitoring. For example, in one embodiment of the invention, a circuit element which is affected by long-term temperature stress can be tested under a variety of applied bias conditions such as NBTI, PBTI or other bias condition.

In addition, the structures according to the herein-described embodiments of the invention are suitable for use as inline process monitors for measuring degradation due to NBTI or PBTI, for example, which are representative of similar transistor at various stages of fabricating a wafer that includes such transistors. By use of such inline process monitors, it is then possible to determine whether a wafer is marginal or not, at an earlier point in time, to permit the wafer to be scrapped, or permit the wafer to be relegated to a non-mission critical use, for example.

Figure 6:
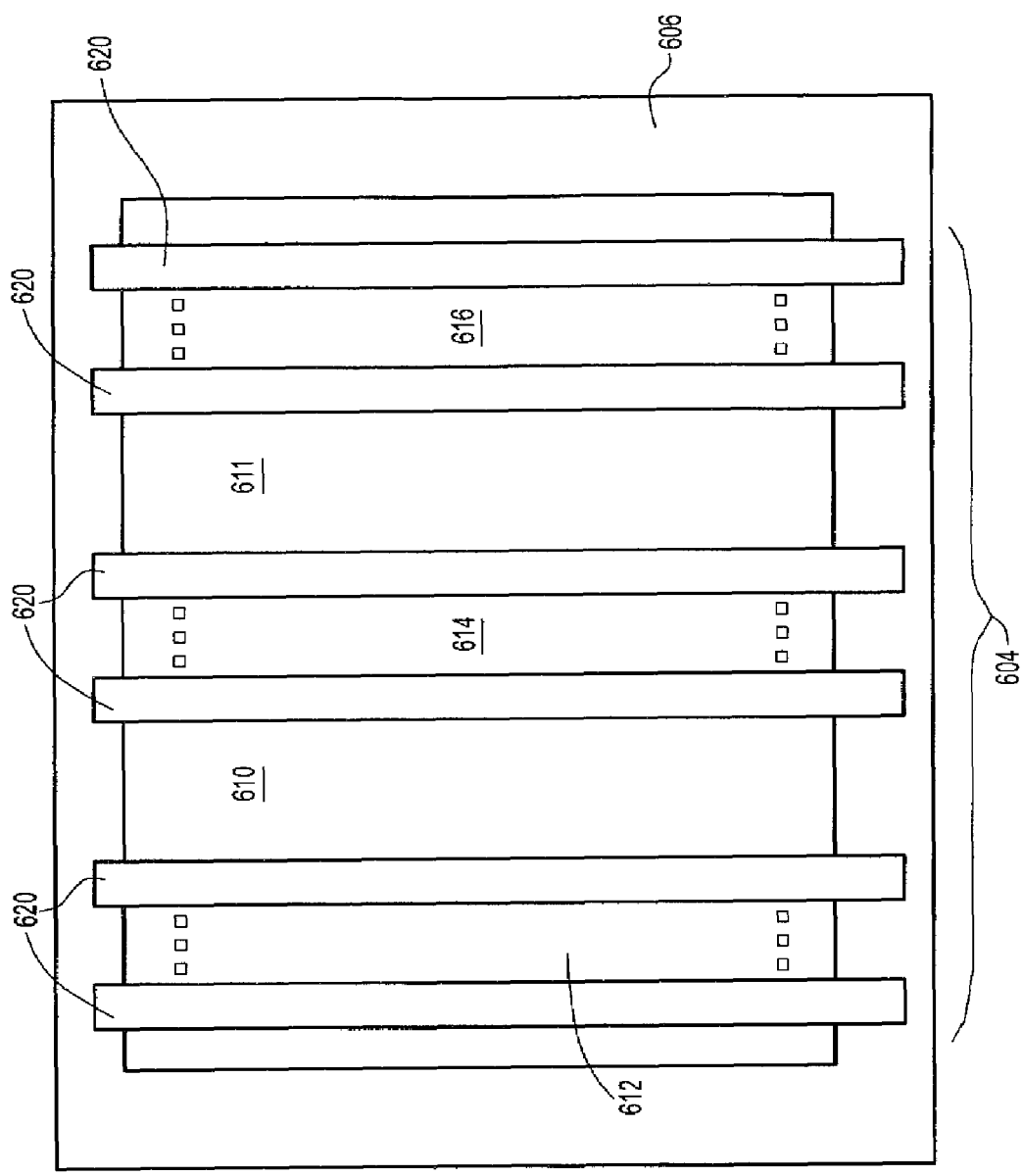
FIG. 6 is a top-down plan view of a semiconductor structure in accordance with another embodiment of the invention.

In another embodiment of the invention illustrated in FIG. 6, a plurality of diffusion heaters 612, 614, 616 are disposed laterally adjacent to respective device-containing semiconductor regions 610, 611 within an active semiconductor area 604 of a substrate. As in the above-described embodiments, the active area is bounded by an STI region 606. In the embodiment shown in FIG. 6, the diffusion heaters are used to heat semiconductor regions 610, 611. As in the above-described embodiments, the semiconductor regions may include one or more active devices such as diodes, transistors and/or other active devices. Alternatively, or in addition to such active devices, the semiconductor regions 610, 611 may include one or more individual passive devices, e.g., devices such as resistors, capacitors and/or inductors, for example. The regions 610, 611 may include groups of such passive and/or active devices. Moreover, the groups may be such as to include portions of circuits or entire circuits. In a particular arrangement, one semiconductor region 610 may include groups of such devices arranged in a circuit or portion of a circuit which, when connected by one or more wiring levels (not shown) of a chip, form circuits or portions of circuits. As in the embodiment described above with respect to FIG. 1A, a plurality of separating gates 620 electrically isolate the portions of the active semiconductor area occupied by the diffusion heaters from the device-containing semiconductor regions 610, 611.

In use, the diffusion heaters are preferably operable as individual heaters or as pairs of heaters that are disposed in proximity to respective ones of the semiconductor regions 610, 611. For example, diffusion heaters 612 and 614 can be operated to heat a first semiconductor region 610 disposed between them to a stress temperature. At the same time, diffusion heater 616 can be maintained in an off condition, such that a second semiconductor region 611 remains below a stress temperature at that time. Alternatively, the diffusion heater 616 can be maintained at a setting which heats region 611 to a low or moderate temperature when the first semiconductor region is heated to its stress temperature. In a third variant, all of the diffusion heaters 612, 614 and 616 are operated at the same time to heat the first and second semiconductor regions 610, 611 to the same temperature or even to different controlled stress temperatures.

Figure 7:
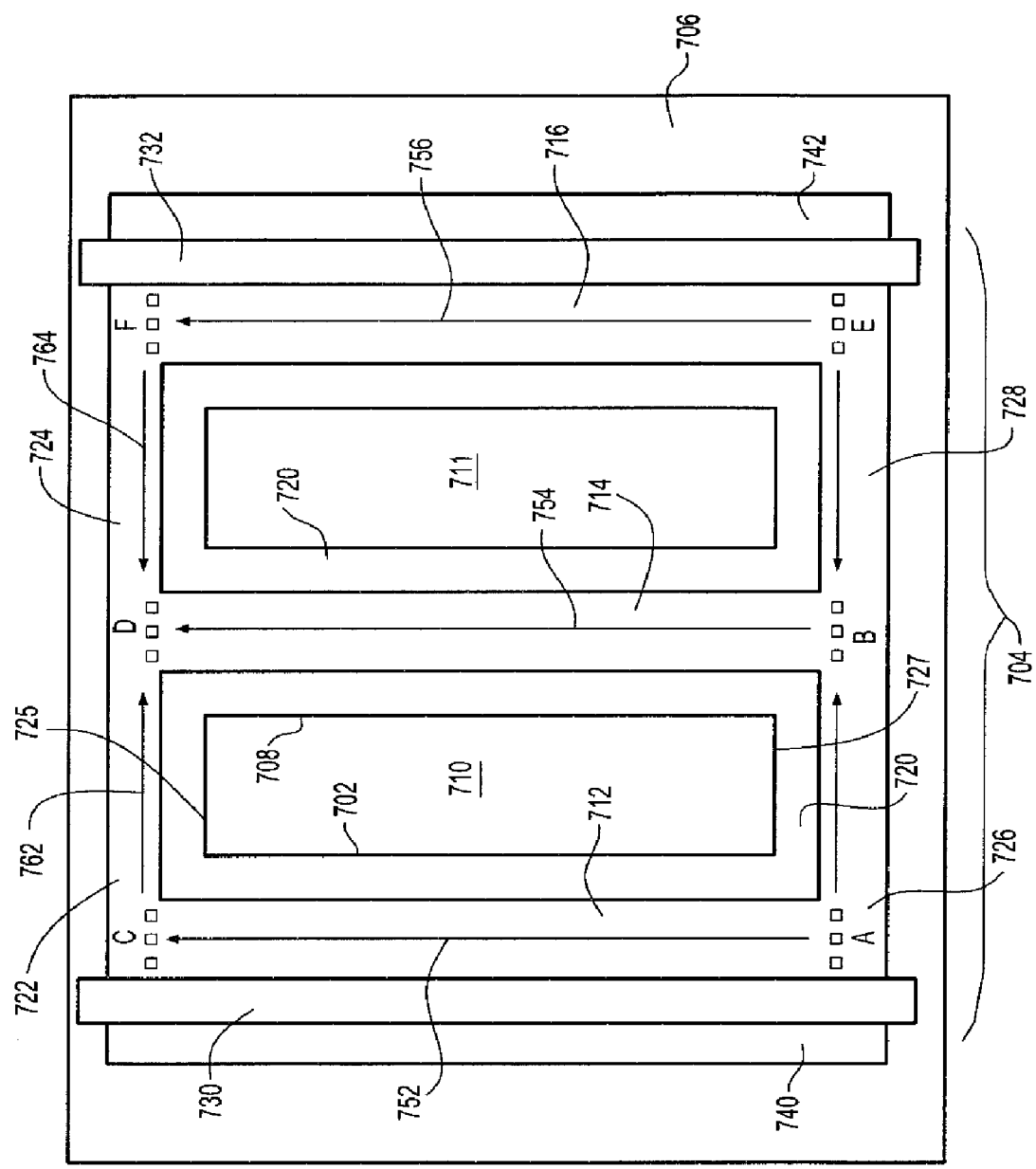
FIG. 7 is a top-down plan view of a semiconductor structure in accordance with yet another embodiment of the invention.

FIG. 7 illustrates a variation of the embodiment described above with respect to FIG. 6 in which the separating gates 720 are annular structures. In this embodiment, the separating gates 720 surround first and second device-containing semiconductor regions 710, 711 within an active semiconductor area 704 that is bounded by an STI region 706. As in the embodiment shown in FIG. 6, a first set of diffusion heaters 712, 714 and 716 are disposed in the active semiconductor area adjacent to the semiconductor regions 710, 711, as separated therefrom by the annular separating gates 720. As shown by arrows 752, 754, and 756 current flow in these diffusion heaters 712, 714, 716 is in a "vertical" layout direction 752 of the active semiconductor area. In addition, a second set of diffusion heaters 722, 724, 726 and 728 are provided in the active semiconductor area adjacent to top ends 725 and bottom ends 727 of the semiconductor regions 710, 711. Preferably, current flow in the second set of diffusion heaters is in the "horizontal" layout direction, being a direction transverse to the vertical direction. Preferably, as shown by arrows 762, 764, current flow within the horizontal diffusion heaters 722, 726 adjacent to a first semiconductor region 710 is in a direction 762 opposite to that of the current flow 764 within the horizontal diffusion heaters 724, 728 adjacent to the second semiconductor region 711. As further shown in FIG. 7, preferably, additional separating gates 730, 732 electrically separate the vertical diffusion heaters 712, 716 from other portions 740, 742, respectively, of the active semiconductor area.

The actual magnitude and direction of current flow within each diffusion heater is controlled by voltages applied to sets of terminals A, B, C, D, E and F at the ends of each diffusion heater, these terminals being provided outside the corners of the separating gates 720. For example, a group of four diffusion heaters 712, 714, 722 and 726 can be operated together to heat the device-containing region 710 which they surround. The remaining diffusion heaters can remain in an off or quiescent state, or at a low temperature setting such that only to the first device-containing region is heated at that time to a stress temperature. To produce such operation, in one example, the voltage applied to terminal set A can be 5 volts, while the voltage applied to terminal set B is 4 volts, the voltage applied to terminal set C being 1 volt and the voltage applied to terminal set D being 0 volts or ground. At such time, the terminal sets E and F are maintained at ground. In such case, the voltage drop across the heaters 712, 714 oriented in the vertical direction is the same (4 V) in each, while the voltage drop across the heaters 722, 726 oriented in the horizontal direction is the same (1V). Because of the 4 V difference in voltages between terminal set B to terminal set E, some current will flow in diffusion heater 728 from terminal set B towards the terminal set E, but because the diffusion heater 716 remains off, the temperature of the semiconductor region 711 can be kept below a stress temperature at that time.

Note that, in addition, a different group of diffusion heaters 714, 716, 724 and 728 can be operated together to heat the other device-containing region 711 when the first group of diffusion heaters 712, 722 and 726 are left in an off or quiescent state or operating at a low temperature setting. In another variation, individual ones of the diffusion heaters surrounding one of the semiconductor regions, e.g., region 710, can be operated at different temperature settings in order to elevate the temperature while also maintaining a temperature gradient across the semiconductor region 710. For example, the diffusion heater 712 can be operated at a high temperature setting using a relatively high current to elevate the semiconductor region 710 along edge 702 to a high temperature. During such time, the diffusion heater 714 can be operated at a moderate temperature setting using a somewhat lower current to elevate the semiconductor region 710 along edge 708 only to a moderate temperature. Because the edges 702, 708 are not heated to the same temperature, the diffusion heaters produce a controlled temperature gradient between the edges. In another example, a controlled temperature gradient can be established between the edges 702, 708 of the semiconductor region when one of the diffusion heaters 712, 714 is operated to heat the semiconductor region to a controlled temperature, while the other one of these diffusion heaters remains off.

While the invention has been described with reference to certain preferred embodiments thereof, those skilled in the art will understand the many modifications and enhancements which can be made without departing from the true scope and spirit of the invention, which is limited only by the appended claims.

What is claimed is:

1. A structure including at least one semiconductor device and a diffusion heater, comprising:

a continuous active semiconductor area of a substrate, said active semiconductor area including:

a first region including one or more semiconductor devices, and a diffusion heater consisting essentially of a semiconductor material included in said active semiconductor area, said diffusion heater disposed adjacent to said first region; and a separating gate overlying an intermediate region of said active semiconductor area between said first region and said diffusion heater, said separating gate biasable to conductively isolate said first region from said diffusion heater.

2. The structure as claimed in claim 1, wherein said one or more semiconductor devices included in said first region has a first junction depth and said diffusion heater has a second junction depth deeper than said first junction depth.

3. The structure as claimed in claim 1, wherein said one or more semiconductor devices includes a field effect transistor ("FET").

4. The structure as claimed in claim 3, wherein said FET includes a source region, a drain region and a channel region disposed between said source and drain regions and an active gate overlying said channel region, said diffusion heater being disposed adjacent to only a first one of said source region and said drain region, and said separating gate extending in a direction parallel to a direction in which said active gate extends.

5. The structure as claimed in claim 1, wherein said first region has a first edge and a second edge remote from said first edge, said diffusion heater is a first diffusion heater adjacent to said first edge, said separating gate is a first separating gate and said structure further comprises a) a second diffusion heater consisting essentially of a semiconductor material included in said active semiconductor area, said second diffusion heater being disposed adjacent to said second edge, and b) a second separating gate overlying said active semiconductor area between said first region and said second diffusion heater, said separating gate being biasable to conductively isolate said first region from said second diffusion heater.

6. The structure as claimed in claim 5, wherein said second diffusion heater is biasable separately from said first diffusion heater.

7. The structure as claimed in claim 6, wherein said first and second diffusion heaters are biasable to produce a temperature gradient across said first region.

8. The structure as claimed in claim 1, wherein said separating gate at least substantially surrounds said first region and said diffusion heater at least substantially surrounds said separating gate.

9. The structure as claimed in claim 8, wherein said one or more semiconductor devices included in said first region has a first junction depth and said diffusion heater has a second junction depth deeper than said first junction depth.

10. The structure as claimed in claim 1, wherein said separating gate is biasable to cause charge carriers to accumulate within said intermediate region.

11. A semiconductor wafer including the structure as claimed in claim 1, wherein said one or more semiconductor devices is representative of each of a plurality of first semiconductor devices provided in said semiconductor wafer, such that said structure is operable to be stressed by applying a voltage stress to said one or more semiconductor devices and heating said one or more semiconductor devices by said diffusion heater.

12. The structure as claimed in claim 8, wherein said diffusion heater includes a plurality of vertical diffusion heaters oriented in a vertical direction of said active semiconductor area and a plurality of horizontal diffusion heaters oriented in a horizontal direction of said active semiconductor area, said structure further comprising a plurality of voltage terminals connected to ends of said plurality of vertical and horizontal diffusion heaters, wherein at least some of said plurality of terminals at said ends of said plurality of vertical diffusion heaters are the same as some of said plurality of terminals at said ends of said plurality of horizontal diffusion heaters.

13. The structure as claimed in claim 12, further comprising a trench isolation region surrounding said active semiconductor area and a well contact region disposed on a side of said trench isolation region opposite from said active semiconductor area.

14. A method of stressing one or more semiconductor devices provided in a semiconductor substrate, comprising:

providing one or more semiconductor devices in a first region of an active semiconductor area of said semiconductor substrate and a diffusion heater in a second region of said active semiconductor area adjacent to said first region;

conducting a current in said diffusion heater to heat said first region; and conductively isolating said first region from a flow of said current.

15. The method as claimed in claim 14, wherein said step of conductively isolating said first region is performed by steps including providing an intermediate region of said active semiconductor area between said first region and said diffusion heater, providing a separation gate overlying said intermediate region, and biasing said separation gate to accumulate charge carriers.

16. The method as claimed in claim 15, wherein said step of biasing said separation gate reverse-biases said intermediate region with respect to said first region.

17. The method as claimed in claim 15, wherein said one or more semiconductor devices includes a field effect transistor ("FET"), said FET including a source region, a channel region and a drain region all disposed within said first region, and said FET further including an active gate overlying said channel region, said method further comprising determining a temperature of said channel region by applying a known current to said active gate, measuring a voltage difference between first and second spaced-apart locations of said active gate to determine a resistance between said first and second spaced apart locations, and determining said temperature from said resistance.

18. The method as claimed in claim 15, wherein said diffusion heater is a first diffusion heater, said method further comprising providing a second diffusion heater in a third region of said active semiconductor area on a side of said first region remote from said first diffusion heater, conducting a second current in said second diffusion heater to heat said first region and conductively isolating said first region from said second diffusion heater.

* * * * *